US008035801B2

(12) United States Patent
Wang et al.

(10) Patent No.: US 8,035,801 B2
(45) Date of Patent: Oct. 11, 2011

(54) METHOD FOR IN-SITU ABERRATION MEASUREMENT OF OPTICAL IMAGING SYSTEM IN LITHOGRAPHIC TOOLS

(75) Inventors: Fan Wang, Shanghai (CN); Mingying Ma, Shanghai (CN); Xiangzhao Wang, Shanghai (CN)

(73) Assignee: Shanghai Micro Electronics Equipment Co., Ltd., Shanghai (CN)

( * ) Notice: Subject to any disclaimer, the term of this patent is extended or adjusted under 35 U.S.C. 154(b) by 472 days.

(21) Appl. No.: 12/295,108

(22) PCT Filed: Dec. 25, 2006

(86) PCT No.: PCT/CN2006/003591
§ 371 (c)(1),
(2), (4) Date: Sep. 29, 2008

(87) PCT Pub. No.: WO2007/112625
PCT Pub. Date: Oct. 11, 2007

(65) Prior Publication Data
US 2010/0177294 A1 Jul. 15, 2010

(30) Foreign Application Priority Data
Apr. 4, 2006 (CN) .......................... 2006 1 0025445

(51) Int. Cl.
G03B 27/52 (2006.01)
G03B 27/42 (2006.01)
(52) U.S. Cl. .......................................... 355/55; 355/53
(58) Field of Classification Search .................... 355/52, 355/53, 55, 77; 430/311; 356/399–401
See application file for complete search history.

(56) References Cited

U.S. PATENT DOCUMENTS

| | | | |
|---|---|---|---|
| 5,615,006 A * | 3/1997 | Hirukawa et al. | 356/124 |
| 5,674,650 A * | 10/1997 | Dirksen et al. | 430/22 |
| 5,801,821 A | 9/1998 | Borodovsky | |
| 5,985,498 A | 11/1999 | Levinson et al. | |
| 6,396,569 B2 | 5/2002 | Zheng et al. | |
| 6,897,947 B1 | 5/2005 | van der Laan et al. | |
| 7,088,426 B2 * | 8/2006 | Hirukawa et al. | 355/55 |

(Continued)

FOREIGN PATENT DOCUMENTS

CN 1570585 1/2005

(Continued)

OTHER PUBLICATIONS

Peter Dirksen, Casper A. Juffermans, Ruud J. Pellens, Mireille Maenhoudt, Peter Debisschop. "Novel aberration monitor for optical lithography." Proc. SPIE 1999, 3679, pp. 77-86.

(Continued)

Primary Examiner — Hung Henry Nguyen
(74) Attorney, Agent, or Firm — Rabin & Berdo, P.C.

(57) ABSTRACT

A method for in-situ aberration measurement in an optical imaging system of lithographic tools. According to the method, a reticle pattern is imaged to form an imaged pattern by transmitting beams through a reticle via the optical imaging system. The imaged reticle pattern is shaped to have plural groups of imaged linewidths. The plural groups of imaged linewidths are measured using either of an image sensor, a CD-SEM and a microscope by modifying the intensity distribution at an exit pupil plane of the optical imaging system. The asymmetry and ununiformity of the imaged linewidths are calculated. Aberrations of the optical imaging system are calculated.

14 Claims, 3 Drawing Sheets

U.S. PATENT DOCUMENTS

| | | | |
|---|---|---|---|
| 7,379,170 B2* | 5/2008 | Huang et al. | 356/124 |
| 2002/0041377 A1* | 4/2002 | Hagiwara et al. | 356/399 |
| 2005/0018164 A1 | 1/2005 | Hansen | |

FOREIGN PATENT DOCUMENTS

| | | |
|---|---|---|
| CN | 1710491 | 12/2005 |
| CN | 1722001 | 1/2006 |
| JP | 11304653 A | 11/1999 |
| JP | 2004247737A A | 9/2004 |
| JP | 2005527117 T | 9/2005 |
| JP | 2006019691 A | 1/2006 |
| JP | 2006086344 A | 3/2006 |
| TW | 554403 | 9/2003 |
| WO | WO-03/100525 A2 | 12/2003 |

OTHER PUBLICATIONS

Van der Laan, Hans, Dierichs, Marcel, van Greevenbroek, Henk, McCoo, Elaine, Stoffels, Fred, Pongers, Richard, Willekers, Rob. "Aerial image measurement methods for fast aberration set-up and illumination pupil verification." Proc. SPIE 2001,4346, pp. 394-407.

Moers, M et al: "Application of the Aberration Ring Test (ARTEMIS) to Determine Lens Quality and Predict Its Lithography Performance", Proceedings of the SPIE—the International Society for Optical Engineering, SPIE, US, vol. 4346, No. Part 01/02, Feb. 27, 2001, pp. 1379-1387, XP008025416, ISSN: 0277-786X.

* cited by examiner

METHOD FOR IN-SITU ABERRATION MEASUREMENT OF OPTICAL IMAGING SYSTEM IN LITHOGRAPHIC TOOLS

TECHNICAL FIELD

The present invention relates to a method for in-situ measuring the image quality of an optical imaging system, particularly to a method for in-situ measuring the aberration of optical imaging systems in lithographic tools.

BACKGROUND ART

It is known in the prior art that an exposure apparatus carries out the exposure process of illuminating the various patterns on the reticles using the exposure light beams, and transferring the patterns onto the substrates such as wafers, glass substrates, etc. coated with photoresist.

In resent years, semiconductor components become more and more integrated, which requires the circuit pattern to be more precise. As feature size decreases, especially with the use of off-axis illumination and phase-shifted mask, the aberrations are having more influence on the quality of lithography process. Thereby, the in-situ measurement technique for optical imaging system in lithography tools is becoming more and more important.

The process of aberration measurement in an optical imaging system will be described as follows with an example of projection optics. Firstly, position the reticle for aberration measurement on the object plane, and image the pattern formed by the reticle onto the substrate via the projection optics. Then, develop the image on the substrate, and use the Scanning Electron Microscope (SEM) to perform the measurement on the developed image. Finally, calculate the aberrations of the projection optics according to the measurement results. (Prior art 1, Peter Dirksen, Casper A. Juffermans, Ruud J. Pellens, Mireille Maenhoudt, Peter Debisschop. "Novel aberration monitor for optical lithography." Proc. SPIE 1999, 3679, 77-86.)

However, in the abovementioned method, the measurement accuracy is related to the lithographic process, such as coating uniformity and developing uniformity. Moreover, pre-processes such as develop must be carried out before utilizing SEM to measure, which prolongs the process of aberration measurement.

To avoid these problems, a method of wavefront aberration measurement for projection optics is provided by using the Transmission Image Sensor (TIS), i.e. the TAMIS technique. (Prior art 2, Van der Laan, Hans, Dierichs, Marcel, van Greevenbroek, Henk, McCoo, Elaine, Stoffels, Fred, Pongers, Richard, Willekers, Rob. "Aerial image measurement methods for fast aberration set-up and illumination pupil verification." Proc. SPIE 2001, 4346, 394-407.)

The TIS comprises a set of sub-micron isolated spaces and a square hole, both of which have a photodiode close behind them. Wherein, the isolated spaces comprise X-direction isolated spaces and Y-direction isolated spaces. Isolated spaces of different directions are used to detect the image positions of the spaces of different directions. The square hole is used to compensate the intensity fluctuations of the light source. The image position (X, Zx) of the X-direction spaces and the image position (Y, Zy) of the Y-direction spaces are determined according to the output of the photodiodes.

During the measurement, the binary optical reticle for aberration measurement is positioned on the reticle stage, which has marks with similar pattern to the TIS. The TIS scans the aerial image of the reticle mark projected by the projection optics horizontally and vertically by moving the wafer stage, and obtains the image position (X, Y, Zx, Zy) of the mark. Comparing the image position with the ideal position, the displacement ($\Delta X$, $\Delta Y$, $\Delta Zx$, $\Delta Zy$) of the image is obtained. The image positions of all the marks under different NA and $\sigma$ are measured to get the imaging displacements at different positions in the field of view under different illumination conditions. Then, the corresponding Zernike coefficients of the aberrations can be calculated by employing the TAMIS algorithm. However higher accuracy of aberration measurement is required to meet the development of lithograph technology. So, it has been more and more difficult for the abovementioned measurement techniques to achieve the high accuracy required.

SUMMARY OF INVENTION

It is an object of the present invention to provide a method for in-situ aberration measurement of the optical imaging systems with high accuracy for lithographic tools to overcome the time consuming and low accuracy of the previous measurement techniques.

In order to achieve the aforementioned object, the present invention is set forth as follows: a method for in-situ aberration measurement of the optical imaging systems in lithographic tools, the optical imaging system comprising a light source for producing light beams; an illumination system for adjusting the intensity distribution and the partial coherence of the beams radiated by the light source; an optical imaging system with an adjustable numerical aperture for imaging the reticle pattern; a reticle stage for supporting the reticle and for accurate positioning; a wafer stage for supporting the wafer and for accurate positioning. The method comprises the steps of: (a) imaging the reticle pattern by the beams transmitting through the reticle via the optical imaging system; (b) using particular tools to measure plural groups of linewidths by modifying the intensity distribution at the exit pupil plane of the optical imaging system; (c) calculating the asymmetry and ununiformity of the linewidths and calculating the aberrations of the optical imaging system.

In the above method, the particular tools comprise an image sensor, a CD-SEM, and a microscope.

The linewidths comprise the linewidth of aerial image, the linewidth of photoresist after exposure and development, the linewidth of pattern after etching, etc.

The reticles comprise binary mask, phase-shifted mask, etc.

The phase-shifted masks comprise alternating phase-shifted mask, attenuated phase-shifted mask, chromeless phase-shifted mask, etc.

The reticle pattern is composed of at least one structure of two bar, three bar, multi-bar, or contact hole.

The intensity distribution at the exit pupil plane of the optical imaging system can be modified by using reticle having marks of different critical dimensions and shapes.

The critical dimension includes the size of each composition of the mark and the distance between compositions of the mark.

The intensity distribution at the exit pupil plane of the optical imaging system can be modified by adjusting the numerical aperture of the object lens.

The intensity distribution at the exit pupil plane of the optical imaging system can be modified by varying the illumination partial coherence or the illumination mode.

The illumination modes include conventional illumination, annular illumination, dual-pole illumination, and quadruple-pole illumination.

The light source is a UV, DUV, or EUV light source such as mercury lamp or excimer laser.

The wavefront aberrations include coma, spherical, astigmatism, and trefoil.

Compared with the known TAMIS technique, the aberration measurement technique based on the asymmetry and ununiformity of the linewidths of the three bar image eliminates the influence of the low-order wavefront aberrations on the sensitivity, thus reducing the error of measurement. In addition, since the number of Zernike coefficients to be measured is reduced from three to two, less NA and σ values are set, thus reducing the time for measurement.

DETAILED DESCRIPTION OF PREFERRED EMBODIMENT

The present invention will be described in detail by reference to the drawings and the preferred embodiment.

Figure 1:
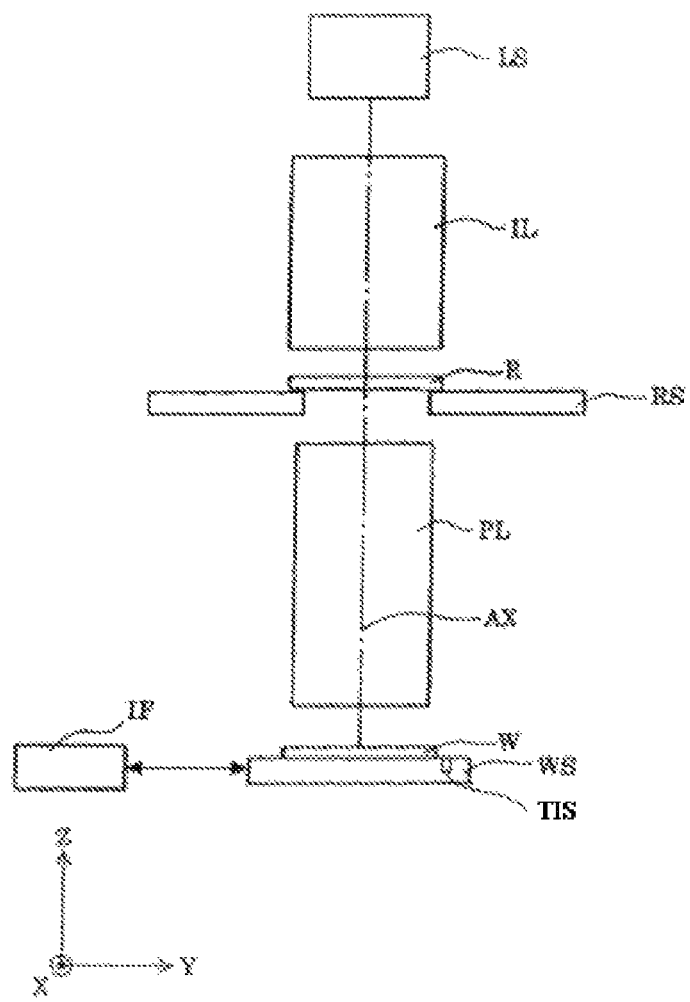
FIG. 1 shows a schematic view of the structure of the exposure apparatus according to one embodiment of the present invention.

As shown in FIG. 1, the system used in the present invention comprises: a light source LS for producing light beams; an illumination system IL for adjusting the intensity distribution and the partial coherence of the beams radiated by the light source; an optical imaging system PL with an adjustable numerical aperture for imaging the reticle pattern; a reticle stage RS for supporting the reticle R and for accurate positioning; a wafer stage WS for supporting the wafer W and for accurate positioning. A transmission image sensor TIS disposed on the wafer stage WS for measuring the image positions of the marks.

The method for in-situ aberration measurement in an optical imaging system of lithographic tools comprises the following steps: defining the sensitivity matrix of the optical imaging system; adjusting the beams produced by the mercury lamp or the excimer laser LS and guiding the beams onto the reticle R via the illumination system IL; selectively transmitting a portion of the beams through the reticle R; imaging the reticle pattern by the beams transmitting through the reticle via the optical imaging system PL; measuring the linewidths using the CD-SEM or image sensor; modifying the intensity distribution at the exit pupil plane of the optical imaging system by using reticles having marks of different critical dimensions and shapes, modifying the numerical aperture of the object lens, or modifying the partial coherence to measure plural groups of image position deviations and aerial image linewidths, and then calculating the aberrations by using the sensitivity matrix.

The wavefront aberration of the object lens refers to the light path difference of the actual wavefront and the ideal wavefront at the exit pupil plane of the object lens. The wavefront aberration can be expressed in terms of the Zernike polynomial:

$$w(\rho,\theta)=Z_1+Z_2\cdot\rho\cos\theta+Z_3\cdot\rho\sin\theta+Z_4\cdot(2\rho^2-1)+Z_5\cdot\rho^2\cos 2\theta+Z_6\cdot\rho^2\sin 2\theta+Z_7(3\rho^3-2\rho)\cos\theta+Z_8(3\rho^3-2\rho)\sin\theta+Z_9\cdot(6\rho^4-6\rho^2+1)+\ldots$$

wherein, $\rho$ and $\theta$ represent the normalized polar coordinate at the exit pupil plane; $Z_2$ and $Z_3$ represent wavefront tilt; $Z_4$ represents focal plane deviation; $Z_5$ and $Z_6$ represent third-order astigmatism; $Z_7$ represents third-order coma aberration in the X direction; $Z_8$ represents third-order coma aberration in the Y direction; $Z_9$ represents third-order spherical aberration.

According to the influence of aberrations on the image quality, the aberrations having a lower order than $Z_5$ can be divided into two parts. In the Zernike polynomial, the aberrations corresponding to the function of $\rho$ and $2n\theta$ (n=0, 1, 2, 3 . . . ) are called even aberrations. The even aberrations mainly comprise astigmatisms ($Z_5$, $Z_6$, $Z_{12}$, $Z_{13}$), spherical aberrations ($Z_9$, $Z_{16}$), etc. The even aberrations mainly influence positions and intensity distributions of the aerial image in the Z direction (vertical). In the Zernike polynomial, the aberrations corresponding to the function of $\rho$ and $(2n+1)\theta$ are called odd aberrations. The odd aberrations mainly comprise coma aberrations ($Z_7$, $Z_8$, $Z_{14}$, $Z_{15}$), trefoil ($Z_{10}$, $Z_{17}$), etc. The odd aberrations mainly influence positions and intensity distributions of the aerial image in the XY plane (horizontal).

Figure 2A:
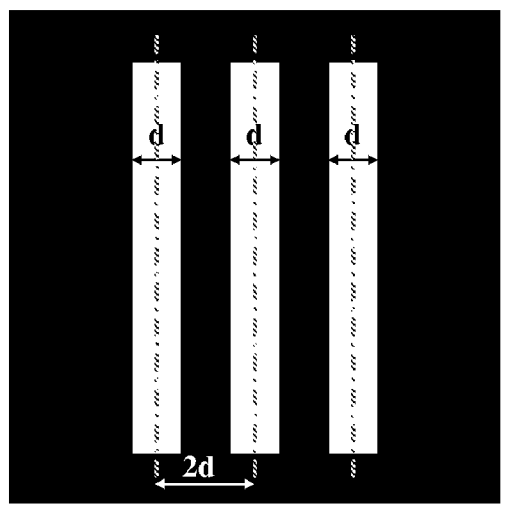
FIG. 2a shows a schematic view of the three bar mark on the reticle.
Figure 2B:
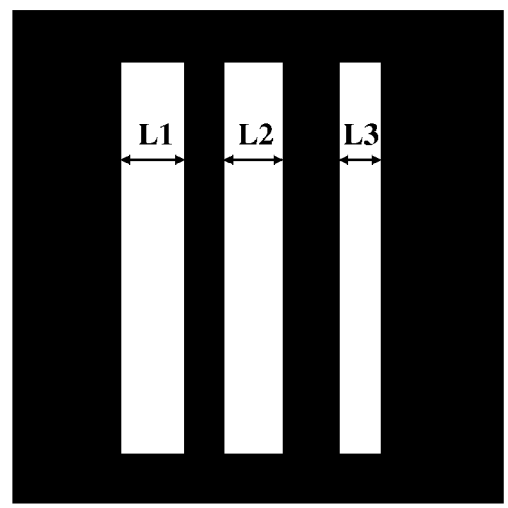
FIG. 2b shows the contour of the aerial image of the three bar mark on the reticle.

FIG. 2a is a schematic view of the three bar mark on the reticle. In the figure, the white parts represent light transparent parts; the black parts represent opaque parts. The linewidth of the mark is d, the distance between two bars is 2 d. The odd aberrations result in the modification of the intensity distribution of the image in the XY plane and the linewidth asymmetry of the image of the mark in the figure. The contour of the image under a given intensity threshold is shown in FIG. 2b. The asymmetry of the linewidth is defined as:

$$LWA=L1-L3, \quad (1)$$

wherein, L1 and L2 are the linewidths of the image under the given threshold. The ununiformity of the linewidth is defined as:

$$LWD=2L2-(L1+L3)$$

The odd aberrations in X direction, such as $Z_7$, $Z_{10}$, $Z_{14}$, influence the linewidth asymmetry of the three bar mark in the X-direction (LWAx), while the odd aberrations in Y direction, such as $Z_8$, $Z_{11}$, $Z_{15}$ influence the linewidth asymmetry of the three bar mark in the Y-direction (LWAy). The even aberrations influence the LWD. The influence of $Z_7$, $Z_{10}$, $Z_{14}$ on the LWAx will be described as follows.

Figure 3:
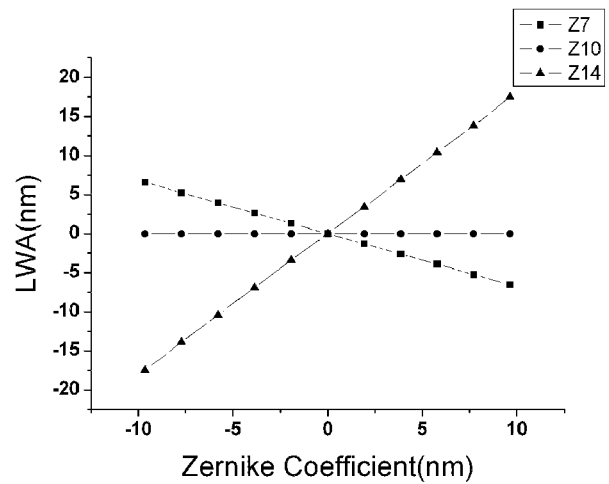
FIG. 3 shows the relation between the odd aberration and the LWA.
Figure 4A:
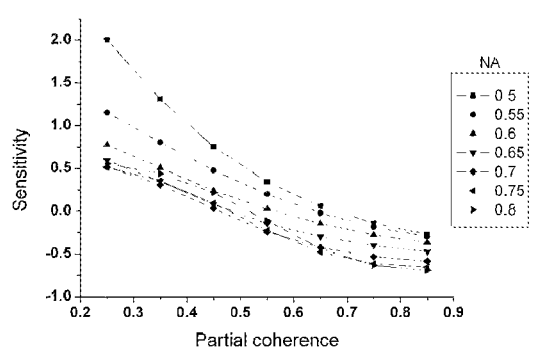
FIG. 4 shows the relation between the numerical aperture, the partial coherences and the Z7 sensitivity calculated by simulation software by using the three bar mark (FIG. 4a, FIG. 4b) and the dense-mark (FIG. 4c, FIG. 4d) of TAMIS.
Figure 4B:
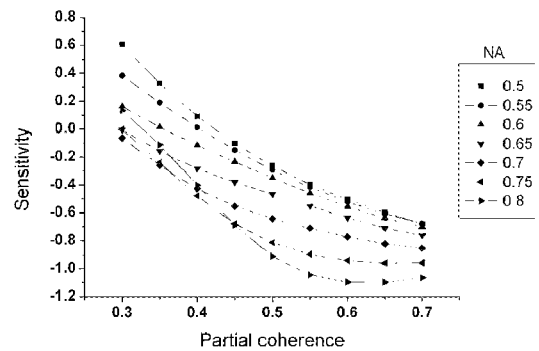
Figure 4C:
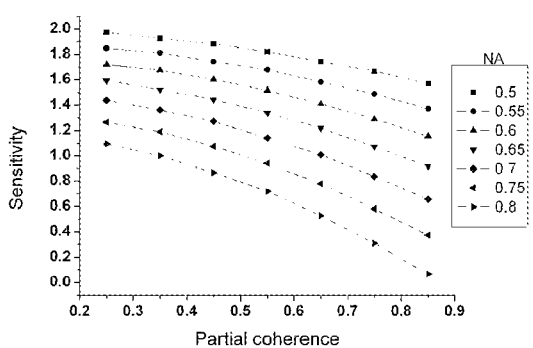
Figure 4D:
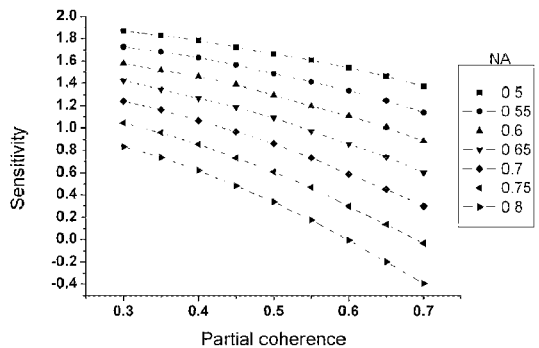
Figure 5A:
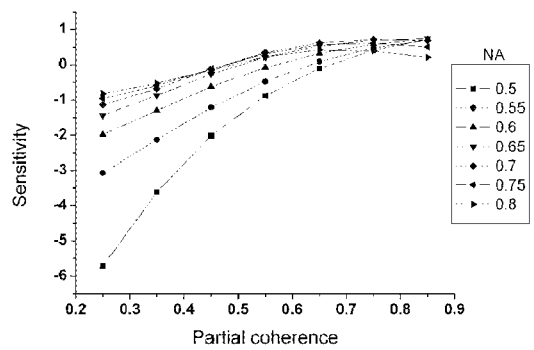
FIG. 5 shows the relation between the numerical aperture, the partial coherences and the Z14 sensitivity calculated by simulation software by using the three bar mark (FIG. 5a, FIG. 5b) and the dense-mark (FIG. 5c, FIG. 5d) of TAMIS.
Figure 5B:
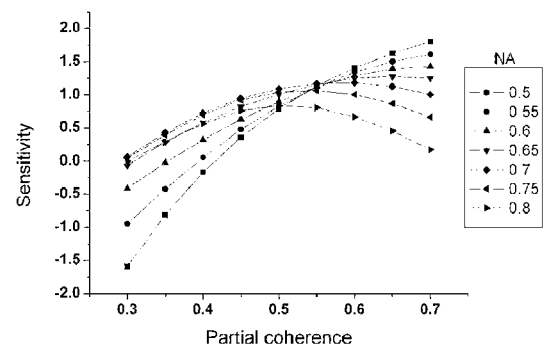
Figure 5C:
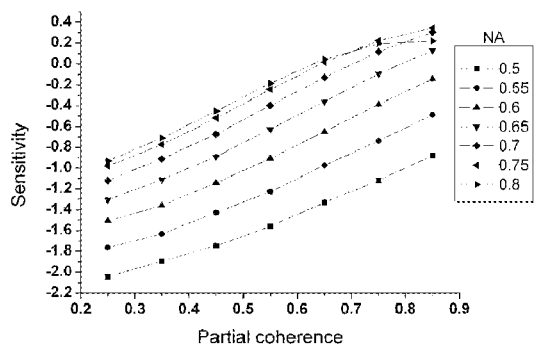
Figure 5D:
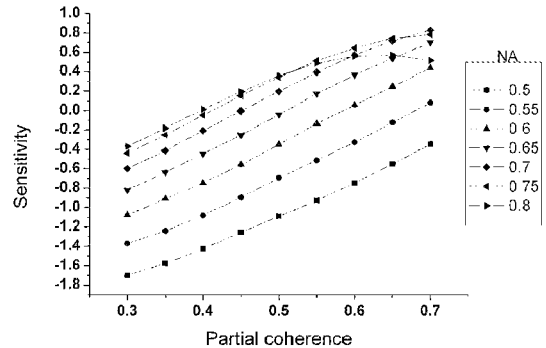

Under the conditions that the largest numerical aperture of the object lens NA=0.8, the partial coherence of annular illumination σ=0.55-0.85, the exposure wavelength is 193 nm, the linewidth of the three bar d=150 nm, the present invention utilizes the lithography simulation software PROLITH to calculate the LWAx caused respectively by $Z_7$, $Z_{10}$, and $Z_{14}$. The results are illustrated in FIG. 3, showing that the linewidth asymmetry and the odd aberrations have a linear relation. The same solution can be achieved by analyzing the simulation results achieved under other conditions. The influence of the cross terms of the odd aberrations can be neglected. Generally, for the lines in the Y-direction, there is:

$$LWAx=S_1(NA,\sigma)Z_7+S_2(NA,\sigma)Z_{10}+S_3(NA,\sigma)Z_{14}, \quad (2)$$

wherein, $S_1$, $S_2$, $S_3$ represent the sensitivities, which are described as follows:

$$S1(NA, \sigma) = \frac{\partial LWA_x(NA, \delta)}{\partial Z_7},$$

$$S2(NA, \sigma) = \frac{\partial LWA_x(NA, \delta)}{\partial Z_{10}},$$

$$S3(NA, \sigma) = \frac{\partial LWA_x(NA, \delta)}{\partial Z_{14}}$$

(3)

The sensitivities S1-S3 can be calculated by lithography simulation software. If calculate the LWAx by the lithography simulation software under the condition that all the Zernike coefficients except $Z_7$ are zero, while $Z_7$ has a certain value, then the result of LWAx divided by $Z_7$ can be regarded as the partial derivative S1.

The linewidth asymmetry can be measured by SEM or a transmission image sensor (TIS). The transmission image sensor is composed of a TIS mark on the wafer stage and an intensity detector. By scanning the aerial image of similar marks on the reticle via the TIS, the intensity distribution can be achieved and the LWA can be calculated.

In this embodiment, a three bar mark having a linewidth of 150 nm is formed on the test reticle. At this time, the influence of trefoil $Z_{10}$ can be neglected. As for the Y-direction lines, the LWAx can be expressed as:

$$LWAx(NA,\sigma) = S1(NA,\sigma)Z7 + S3(NA,\sigma)Z14 \quad (4)$$

wherein, LWAx(NA,σ) represents the linewidth asymmetry of Y-direction lines measured at the given numerical aperture and partial coherence. The following matrix equations can be achieved by measuring the LWAx under 5 groups of different NA and a values:

$$\begin{bmatrix} LWAx(NA_1, \sigma_1) \\ LWAx(NA_2, \sigma_2) \\ \vdots \\ \vdots \end{bmatrix} = \begin{bmatrix} \frac{\partial LWAx(NA_1, \sigma_1)}{\partial Z_7} & \frac{\partial LWAx(NA_1, \sigma_1)}{\partial Z_{14}} \\ \frac{\partial LWAx(NA_2, \sigma_2)}{\partial Z_7} & \frac{\partial LWAx(NA_2, \sigma_2)}{\partial Z_{14}} \\ \vdots & \vdots \\ \vdots & \vdots \end{bmatrix} \begin{bmatrix} Z_7 \\ Z_{14} \end{bmatrix} \quad (5)$$

The equations (5) can be expressed in a simplified way as L=S·Z, wherein, L represents the LWAx measured under different NA and σ; Z represents the Zernike coefficient vector to be calculated; S represents the sensitivity matrix. The equations are overdetermined, and can be calculated based on least-squares algorithm.

Measuring the linewidths asymmetry (LWAx, LWAy) at different positions within the field of view under 5 groups of different NA and σ values, the Zernike coefficient $Z_7$, $Z_8$, $Z_{14}$, $Z_{15}$ at corresponding positions within the field of view can be calculated according to equations (5).

Under the same TIS measurement accuracy, the variation range of the sensitivity is the key factor of the accuracy of coma aberration measurement. The sensitivity variation ranges of the TAMIS measurement technique and the aberration measurement technique based on the linewidth asymmetry will be compared in the following paragraph. To simplify the description, the exposure wavelength is assumed to be 193 nm, and the maximum numerical aperture of the object lens is 0.8.

FIG. 4 shows the $Z_7$ sensitivities of the three bar mark LWAx and TAMIS measurement at different NA and illumination settings calculated by software PROLITH. FIGS. 4a and 4b respectively shows the relation between the $Z_7$ sensitivity of the three bar mark LWAx and the NA, σ under the conventional illumination mode and the annular illumination mode with an annular width of 0.3. FIGS. 4c and 4d respectively shows the relation between the $Z_7$ sensitivity of the TAMIS measurement and the NA, σ under the conventional illumination mode and the annular illumination mode with an annular width of 0.3. It is known from FIG. 4 that, considering both the results under the annular illumination and conventional illumination modes, the $Z_7$ sensitivity of the three bar mark LWAx varies from −1.10 to 2.00, having a variation range of 3.30; while the $Z_7$ sensitivity of the TAMIS measurement varies from −0.40 to 1.97, having a variation range of 2.37. The coma measurement technique based on the three bar linewidth asymmetry can widen the variation range of the $Z_7$ sensitivity by 30.8%.

FIG. 5 shows the $Z_{14}$ sensitivities of the three bar mark LWAx and TAMIS measurement under different NAs and illumination settings calculated by software PROLITH. FIGS. 5a and 5b respectively shows the relation between the $Z_{14}$ sensitivity of the three bar mark LWAx and the NA, σ under the conventional illumination mode and the annular illumination mode with annular width of 0.3. FIGS. 5c and 5d respectively shows the relation between the $Z_{14}$ sensitivity of the TAMIS measurement and the NA, σ under the conventional illumination mode and the annular illumination mode with annular width of 0.3. It is known from FIG. 5 that, considering both the results under the annular illumination and conventional illumination modes, the $Z_{14}$ sensitivity of the three bar mark LWAx varies from −5.71 to 1.81, having a variation range of 7.52; while the $Z_{14}$ sensitivity of the TAMIS measurement varies from −2.04 to 0.83, having a variation range of 2.87. The coma measurement technique based on the three bar linewidth asymmetry can widen the variation range of the $Z_{14}$ sensitivity by 162%.

The accuracy of the sensitivity matrix and the sensitivity degree are the key factors influencing the measurement accuracy of the Zernike coefficients. That is to say, using the three bar marks, the variation range of the sensitivities can be widened with respect to variation of NA and σ. The sensitivity of the sensitivity matrix in aberration measurement of the object lens can be raised through measuring the linewidths. The present method of wavefront aberration measurement based on linewidth measurement can increase the accuracy of aberration measurement by a quantity of several ten percent.

The variation range of the sensitivity of the Zernike coefficient can also be widened by using phase shift reticles.

Although the preferred embodiment of the present invention is disclosed, technicians of this field should aware that any modification, interpolation or variation within the principle of the present invention falls in the scope of the present invention.

What is claimed is:

1. A method for in-situ aberration measurement in an optical imaging system of lithographic tools, the optical imaging system comprising:
    a light source for producing light beams;
    an illumination system for adjusting the intensity distribution of the beams radiated by the light source;
    an optical imaging apparatus for imaging a reticle pattern formed on a reticle onto a wafer;
    a reticle stage for supporting and accurately positioning the reticle;
    a wafer stage for supporting and accurately positioning the wafer, characterized in that the method comprises the steps of:

(a) imaging the reticle pattern to form an imaged pattern by transmitting the beams through the reticle via the optical imaging system, the imaged reticle pattern being shaped to have plural groups of imaged linewidths;

(b) measuring the plural groups of imaged linewidths of the imaged pattern using either of an image sensor, a CD-SEM and a microscope by modifying the intensity distribution at an exit pupil plane of the optical imaging system;

(c) calculating the asymmetry and ununiformity of the imaged linewidths and calculating aberrations of the optical imaging system.

2. The method for in-situ aberration measurement in an optical imaging system of a lithographic tools as claimed in claim 1, characterized in that the imaged linewidths comprise a linewidth of an aerial image, a linewidth of a photoresist after exposure and development, and a linewidth of a pattern after etching.

3. The method for in-situ aberration measurement in an optical imaging system of lithographic tools as claimed in claim 1, characterized in that the reticle comprises a binary mask and a phase-shifted mask.

4. The method for in-situ aberration measurement in an optical imaging system of lithographic tools as claimed in claim 3, characterized in that the phase-shifted mask is selected from the group consisting of an alternating phase-shifted mask, an attenuated phase-shifted mask and a chromeless phase-shifted mask.

5. The method for in-situ aberration measurement in an optical imaging system of lithographic tools as claimed in claim 1, characterized in that the reticle pattern is composed of at least one structure selected from the group consisting of three bars, two bars, multiple bars, and a contact hole.

6. The method for in-situ aberration measurement in an optical imaging system of lithographic tools as claimed in claim 1, characterized in that the intensity distribution at the exit pupil plane of the optical imaging system is modified by changing critical dimensions or shapes of a mark or changing the phase shift status of the mark.

7. The method for in-situ aberration measurement in an optical imaging system of lithographic tools as claimed in claim 6, characterized in that the critical dimensions include the size of each of compositions of the mark and a distance between the compositions of the mark.

8. The method for in-situ aberration measurement in an optical imaging system of lithographic tools as claimed in claim 1, characterized in that the intensity distribution at the exit pupil plane of the optical imaging system is modified by adjusting the numerical aperture of an object lens.

9. The method for in-situ aberration measurement in an optical imaging system of lithographic tools as claimed in claim 1, characterized in that the intensity distribution at the exit pupil plane of the optical imaging system is modified by varying illumination partial coherence or illumination modes.

10. The method for in-situ aberration measurement in an optical imaging system of lithographic tools as claimed in claim 9, characterized in that the illumination modes include conventional illumination, annular illumination, dipole illumination, and quadpole illumination.

11. The method for in-situ aberration measurement in an optical imaging system of lithographic tools as claimed in claim 1, characterized in that the light source is selected from the group consisting of UV, DUV, and EUV light sources selected from the group consisting of a mercury lamp and an excimer laser.

12. The method for in-situ aberration measurement in an optical imaging system of lithographic tools as claimed in claim 1, characterized in that the aberrations of the optical imaging system are wavefront aberrations and the wavefront aberrations include coma, spherical, astigmatism, and trefoil.

13. The method for in-situ aberration measurement in an optical imaging system of lithographic tools as claimed in claim 1, characterized in that the imaged pattern includes thereon a first line, a second line and a third line in the order of the first line, the second line and the third line, and the asymmetry of the imaged linewidths is calculated by subtracting the linewidth of the third line from the linewidth of the first line.

14. The method for in-situ aberration measurement in an optical imaging system of lithographic tools as claimed in claim 1, characterized in that the imaged pattern includes thereon a first line, a second line and a third line in the order of the first line, the second line and the third line, and the ununiformity of the imaged linewidths is calculated by subtracting the sum of the linewidths of the first and third lines from two times of the linewidth of the second line.

* * * * *